United States Patent

Lye

[11] Patent Number: 6,054,884
[45] Date of Patent: Apr. 25, 2000

[54] PROCESS-INSENSITIVE CONTROLLABLE CMOS DELAY LINE

[75] Inventor: William Michael Lye, Burnaby, Canada

[73] Assignee: PMC - Sierra Ltd., Burnaby, Canada

[21] Appl. No.: 09/012,519

[22] Filed: Jan. 23, 1998

[51] Int. Cl.[7] .................................................. H03H 11/26
[52] U.S. Cl. .......................... 327/269; 327/271; 327/272; 327/284; 327/285
[58] Field of Search ...................................... 327/269, 271, 327/272, 274, 276, 277, 278, 280, 281, 284, 285, 287, 288, 293, 295, 298

[56] References Cited

U.S. PATENT DOCUMENTS

5,295,174  3/1994  Shimizu ..................................... 377/76
5,489,867  2/1996  Tamanoi ................................... 327/269

Primary Examiner—Timothy P. Callahan
Assistant Examiner—Cassandra Cox
Attorney, Agent, or Firm—Anderson, Levine & Lintel, LLP

[57] ABSTRACT

A delay cell for use in binary delay line which includes a delay circuit having N outputs where $N \geq 2$, each delay circuit coupled to an input through N−1 serially connected unit cells. For each output there are P unit cells having a unit delay of $t_{P0}$ and N−1−P unit cells having a unit delay of $t_{p1}$. The N outputs are ordered such that each output other than the first is delayed with respect to an immediately preceding output by $t_{p1} - t_{p0}$, and P goes in succession from N−1 to 0 in unit steps. Each value of P corresponds to only one of the N outputs.

21 Claims, 7 Drawing Sheets

PROCESS-INSENSITIVE CONTROLLABLE CMOS DELAY LINE

FIELD

The present invention relates to a delay line controlled by external digital signals that accurately synthesizes a number of delayed versions of an input signal.

BACKGROUND

Figure 1A:
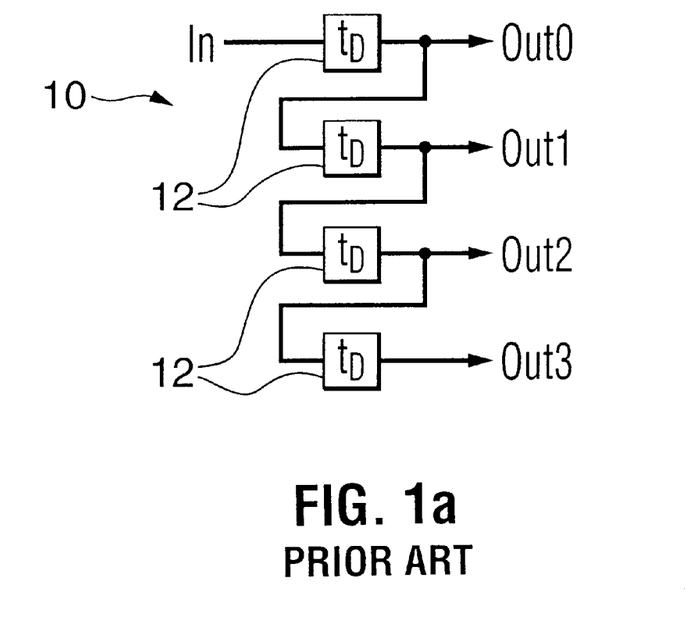
FIG. 1a is a circuit diagram of a conventional delay line architecture and FIG. 1b shows output signals from successive outputs of FIG. 1a FIG. 2 is a circuit diagram of a delay line consisting of a chain of cascaded inverters.
Figure 1B:
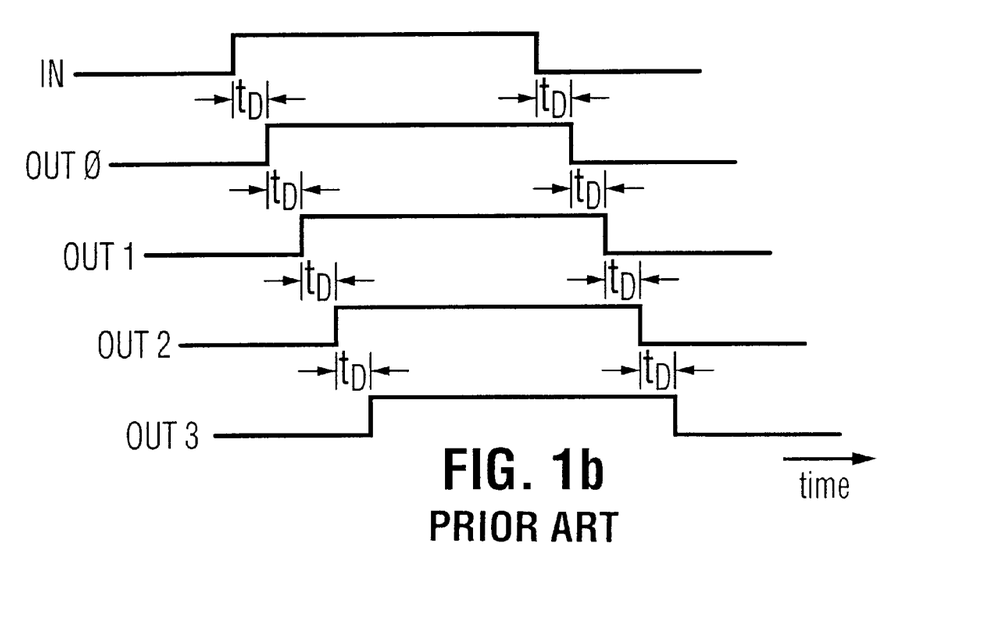

A delay line is used to produce a number of digital signals, each one delayed in time with respect to each other. Applications of delay lines include but are not limited to clock generation, Finite Impulse Response filters, and clock recovery. A classic delay line structure 10 and its output signals are shown in FIGS. 1a and 1b. In this classical delay line structure 10, a chain of unit delay cells 12 with a known propagation delay are cascaded together, resulting in the unit output delay being determined by the propagation delay of each of the unit delay cells 12. At the board level, devices such as Surface Acoustic Wave (SAW) devices or piezo-electric quartz crystals are available which produce high-accuracy delay times. However, for delays which must be incorporated on a semiconductor chip, only standard semiconductor devices are available.

Figure 2:
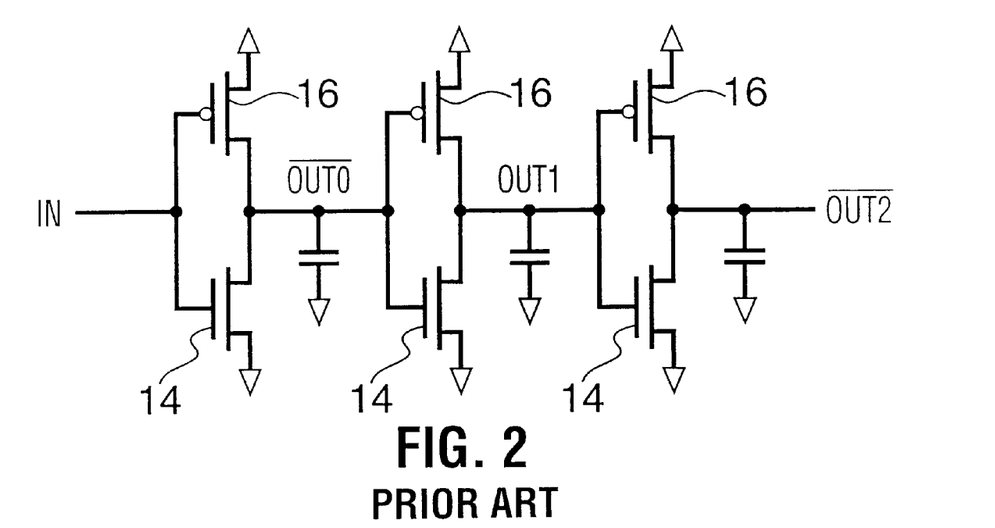

The simplest on-chip delay line is a chain of cascaded inverters shown in FIG. 2 as pairs of pMOS devices 16 and nMOS devices 14. The key advantage of such circuits is their speed: they are the fastest unit circuits available which produce full-rail outputs. Their key disadvantage is the extreme variability of the inverter propagation delays with process, temperature and power supply voltage. Variations of −50% to +100% of nominal propagation delays are not unusual. In addition, controlling this delay line may be difficult as it would involve modulation of the power supply voltage. Such modulation would, in turn, require that additional circuitry be included which translates the inverter outputs to full-rail CMOS outputs.

Figure 3:
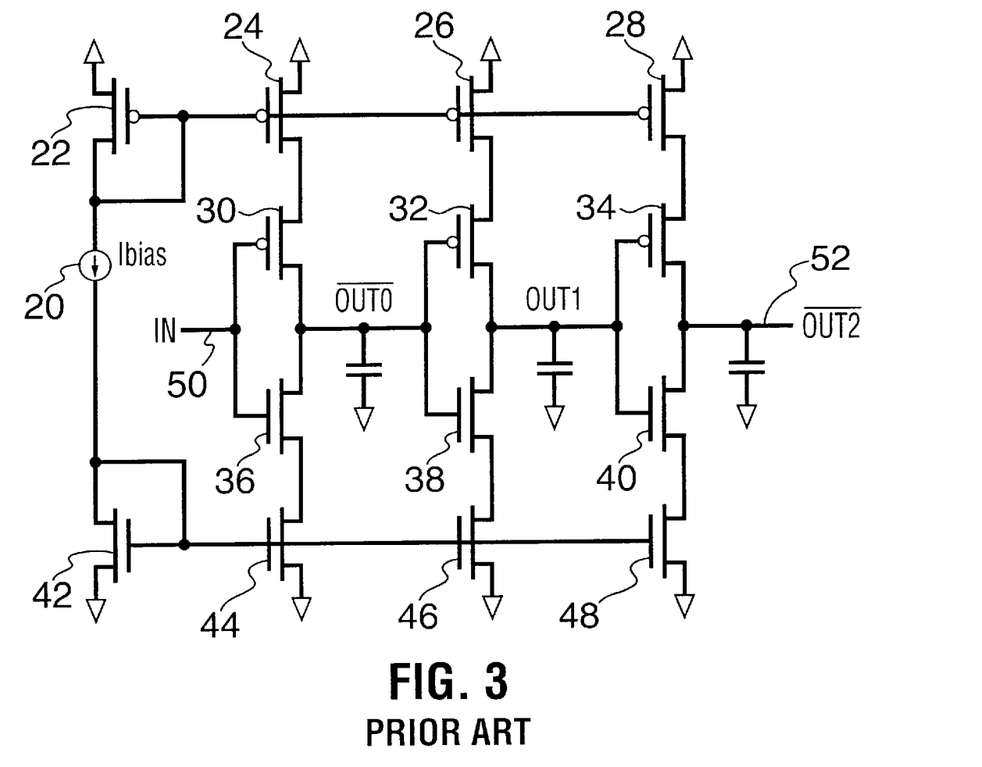
FIG. 3 is a circuit diagram of a delay line known as a "starved inverter" structure.

A better delay line structure is the so-called "starved inverter" structure, shown in FIG. 3. The bias current source 20 sets the currents through the diode-connected pMOS 22 and nMOS 42 transistors and generate bias voltages. A bias voltage is thus supplied from the pMOS transistor 22 to the replica pMOS transistors 24, 26, and 28, setting the current through transistors 24, 26 and 28 to mirror the bias current 20. Similarly, the bias voltage from the nMOS transistor 42 is applied to the replica nMOS transistors 44, 46 and 48 so that the current through the latter transistors mirrors that of current source 20. The remainder of the circuit comprising transistors 30, 32, 34, 36, 38, and 40 is configured as the inverter chain delay line of FIG. 2. This circuit produces full-rail CMOS outputs and is controllable by modulating the input bias current source, however, mismatches between the n-channel and p-channel current sources or in inverter threshold voltages will appear as delay mismatches in the outputs. Since this circuit's unit delays are now mainly determined by currents and capacitances, not the internal structure of the CMOS inverter, the delays generated by this circuit show less variation with process, temperature and voltage. Typically, the bias current will be generated by an on-chip resistor and voltage reference, so the unit delay is a function of an RC delay, which given appropriate component types, can be controlled to within ±20%, sufficient for many applications.

Additional implementations are possible using reduced-swing, source-coupled or current-mode logic styles. These all have the advantage of speed (compared to either of the circuits of FIGS. 2 or 3), but may require large DC power dissipation or require additional control circuitry in order to produce a low sensitivity controlled delay.

Figure 4:
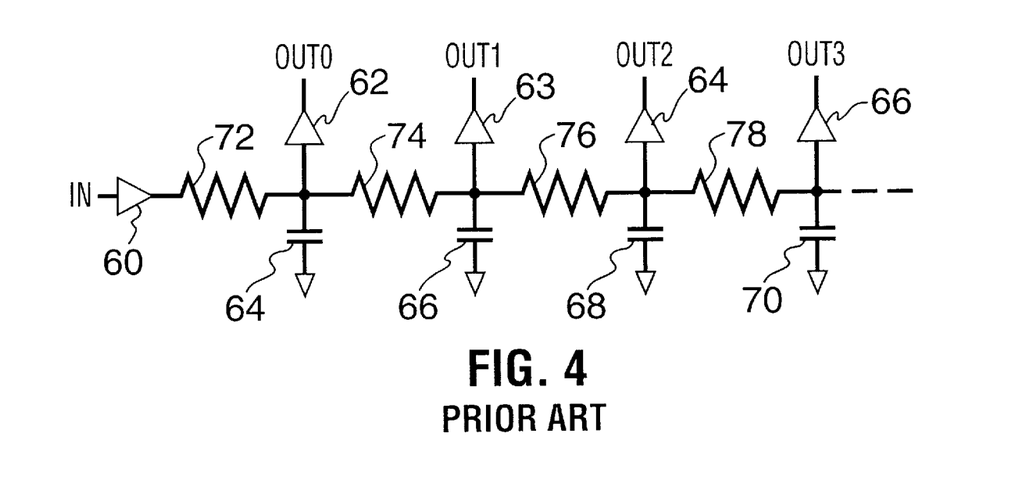
FIG. 4 is a circuit diagram of an RC delay line.

A major shortcoming of all delay cells based on the architecture of FIG. 1 is a process-imposed minimum propagation delay per stage, and, as a result, these circuits have a minimum unit delay. It is impossible to synthesize a unit delay smaller than the propagation delay through the cells traversed as the limit is set by the CMOS process and is therefor a process-imposed limit. In order to produce a unit delay smaller than this minimum, other techniques must be used. A circuit which uses an RC ladder network to synthesize a particular unit delay, is shown in FIG. 4. In this circuit the input is coupled by a buffer amplifier 60 to a first RC network made up of resistor 72 and capacitor 64. The output is taken through buffer amplifier 62. Similar RC networks made up of resistors 74, 76, and 78 and corresponding capacitors 66, 68, and 70, respectively, in cascade, provide additional delays. Additional outputs are taken through buffer amplifiers 63, 64, and 66. In this circuit, the delay is synthesized by cascaded RC delays which, as described earlier, can be controlled to within ±20%. While this circuit can synthesize delays which are smaller than the minimum propagation delay available in a given technology, this technique requires additional analog circuitry to convert the RC network outputs into digital signals, which can require significant DC power. Finally, in order to create a controllable delay line, either the resistances or the capacitances must be controllable, increasing the complexity of the circuit and increasing the sensitivity of the circuit to process, temperature and voltage variations.

Accordingly, it is an object of the invention to provide a delay circuit that can synthesize a unit delay time smaller than the minimum propagation delay of a single unit delay cell. It is a further object of the invention to provide an easily-controlled delay line structure whose delay can be modulated between 100 ps and 1 ns using digital inputs. It is yet a further object of the invention to provide a delay line circuit that can accept differential CMOS inputs and produce differential CMOS outputs. Another object is to provide a circuit that minimizes DC power dissipation of the delay line. Finally, it is an object of the invention to provide a delay line circuit that minimizes the sensitivity of the unit delay to process, voltage and temperature.

SUMMARY OF THE INVENTION

According to the invention there is provided a delay circuit having N outputs where N≧2, each delay circuit coupled to an input through N−1 serially connected unit delay cells. For each output there are P unit delay cells having a unit delay of $t_{P0}$ and N−1−P delay unit cells having a unit delay of $t_{P1}$. The N outputs are ordered such that each output other than the first is delayed with respect to an immediately preceding output by $t_{P0}-t_{P0}$, and P goes in succession from N−1 to 0 in unit steps. Each value of P corresponds to only one of the N outputs.

Each unit delay cell may include a pair of starved inverters, each starved inverter made up of a pMOS and nMOS transistor with a drain of the pMOS transistor connected to a drain of the nMOS transistor, the gates of the pMOS transistors are connected to respective gates of the nMOS transistors, the sources of the pMOS transistors in each of the starved inverters are connected together, and the sources of the nMOS transistors in each of the starved inverters are connected together. The gates of the pair of starved inverters provide a differential input and the drains of the pMOS transistors of the pair of starved inverters provide a differential output. A pMOS current source has a drain coupled to the sources of the pMOS transistors of the pair of starved inverters and a source coupled to a positive voltage supply line. An nMOS current source has a drain coupled to sources of the nMOS transistors of the pair of starved inverters and a source coupled to a negative voltage supply line. A differential amplifier has an inverting input coupled to the drain of the pMOS transistor of a first one of the pair of starved inverters and a non-inverting input coupled to a drain of the pMOS transistor of a second one of the pair of starved inverters. A first capacitor is coupled between the inverting input of the differential amplifier and a negative voltage supply line, and a second capacitor, substantially identical to the first capacitor, is coupled between the non-inverting input of the differential amplifier and a negative voltage supply line.

A gate of the pMOS current source may be coupled to a voltage reference source comprising a pMOS transistor having its gate coupled to its source, a source of the pMOS transistor coupled to a current generator and a drain of the pMOS transistor is coupled to the positive voltage supply line. A gate of the nMOS current source may be coupled to a voltage reference source comprising an nMOS transistor having its gate coupled to its source and its drain. The source of the nMOS transistor may be coupled to a negative voltage supply line.

The first and second capacitors may be variable. By making these capacitors variable it is possible to change the propagation delay simply by changing the capacitance of both capacitors.

Advantageously, the differential amplifier may be self-biased in a manner that dissipates no static power for the case that the input voltages are at the power supply rails. Since the starved inverter transistors saturate with DC power supply voltages across the capacitors, the only DC power consumption in the circuit occurs in the reference circuitry, the bias current and the power dissipated by transistors coupled to the current generator.

The current generator bias current may be adjustable. As with the capacitors, adjusting the current generator current, changes the propagation delay.

A digital to analog converter may be coupled to the current generator to control the amount of bias current produced thereby. Such a device allows adjustment of the bias current with digital input circuitry.

In another aspect of the invention there is provided a delay circuit having N outputs where N≧2, including an Rth output of the N outputs coupled to the input through an Rth one of the N parallel delay lines. Each of the N parallel delay lines has N−1 serially connected unit delay cells, and the Rth delay line has N−R serially connected unit delay cells with unit delays of $t_{P0}$ and R−1 serially connected unit delay cells which have unit delays of $t_{P1}$. R is an integer going from 1 to N and signals from an Rth output are delayed from corresponding signals on an (R−1)th output by $t_{P1}-t_{P0}$ for all values of R.

In yet another aspect of the invention there is provided a delay circuit having N outputs where $N=2^Q$ and Q is an integer >1. The delay circuit has $2^{k-1}$ zeros branches each having $N/2^k$ serially connected unit delay cells each with a unit delay $t_{P0}$, and $2^{k-1}$ ones branches each having $N/2^k$ serially connected unit delay cells each with a unit delay $t_{P1}$. The parameter k goes from Q in unit steps down to 1. For each value of k, inputs of the $2^{k-1}$ zeros branches are connected to inputs of corresponding ones of the $2^{k-1}$ ones branches to form $2^{k-1}$ common terminals. The N outputs are ordered such that each output other than the first is delayed with respect to an immediately preceding output by $t_{P1}-t_{P0}$.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 5:
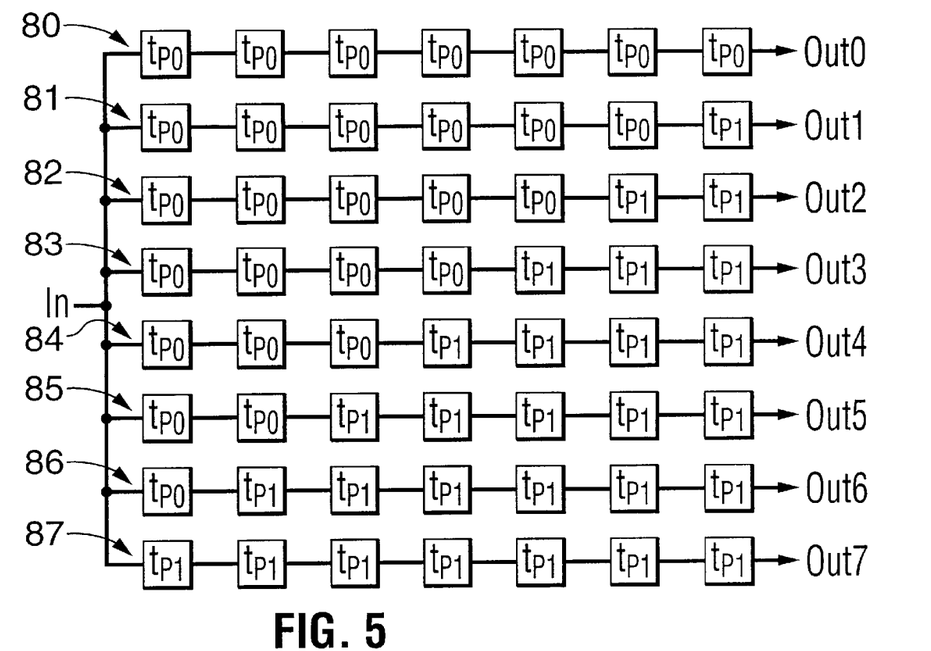
FIG. 5 is a schematic diagram of an 8-stage parallel delay line circuit.

Referring to FIG. 5, there is shown a circuit for synthesizing a unit delay as a difference in propagation delays between two unit delay cells. In this circuit unit delay cells with delays of $t_{P0}$ and $t_{P1}$ are arranged in parallel rows with 7 cells in each row. In the first row 80 all of the cells have unit delays $t_{P0}$. In the second row 81, all except the last cell have unit delays of $t_{P0}$ while the last has a unit delay of $t_{P1}$. For each row 82 to 87 thereafter the number of cells having a unit delay of $t_{P1}$ increases by one until the cells in the eighth row 87 all have a unit delay of $t_{P1}$. By choosing $t_D$ equal to $t_{P1}-t_{P0}$ each successive output is delayed from the previous output by $t_D$. One disadvantage to this solution is that the minimum delay through the entire delay line is $7t_{P0}$, not $t_D$. However, for applications such as generating clocks for an analog transversal delay FIR filter, this is not a problem. Another disadvantage is that this 8-output delay line requires 56 unit delay elements.

Figure 6:
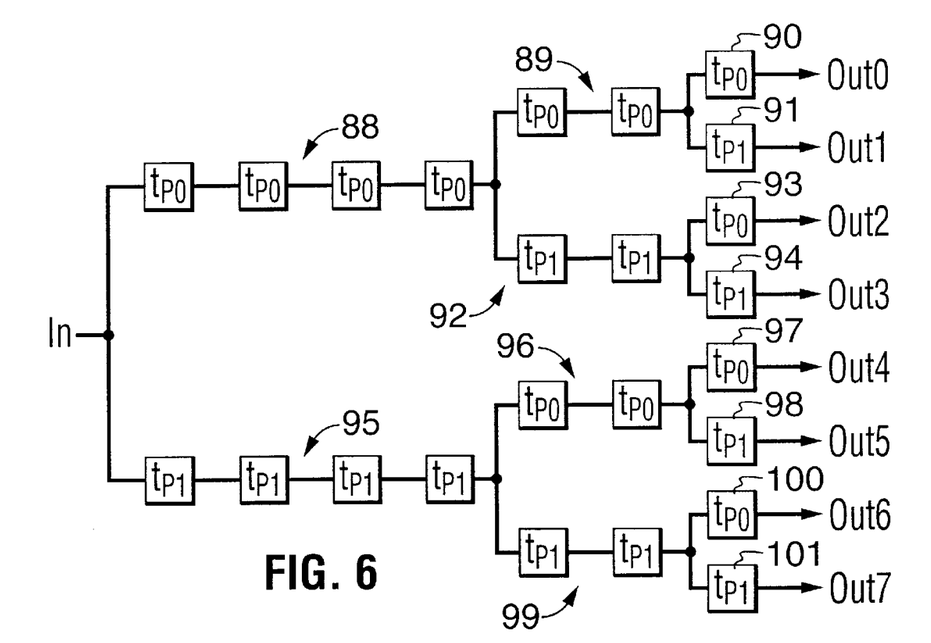
FIG. 6 is a schematic diagram of an 8 stage binary tree delay line.

Referring to FIG. 6, there is shown a binary tree arrangement which produces the same delays as the circuit of FIG. 5 but with only 24 unit delay elements. Branch 88 uses 4 unit delays each of delay $t_{P0}$. Branch 89 contains two unit delays each of delay $t_{P0}$ while branch 92 contains two unit delays each of delay $t_{P1}$. Unit cells 90 and 93 are each of delay $t_{P0}$ while unit cells 91 and 94 are each of delay $t_{P1}$. Branches 95, 96, and 99 and cells 97, 98, 100, and 101 form a tree identical to that constituted by branch 88 and the branches connected thereto except that branch 95 is made up of four cells each of unit delay $t_{P1}$. The latter circuit results in significant area and power savings.

Figure 7:
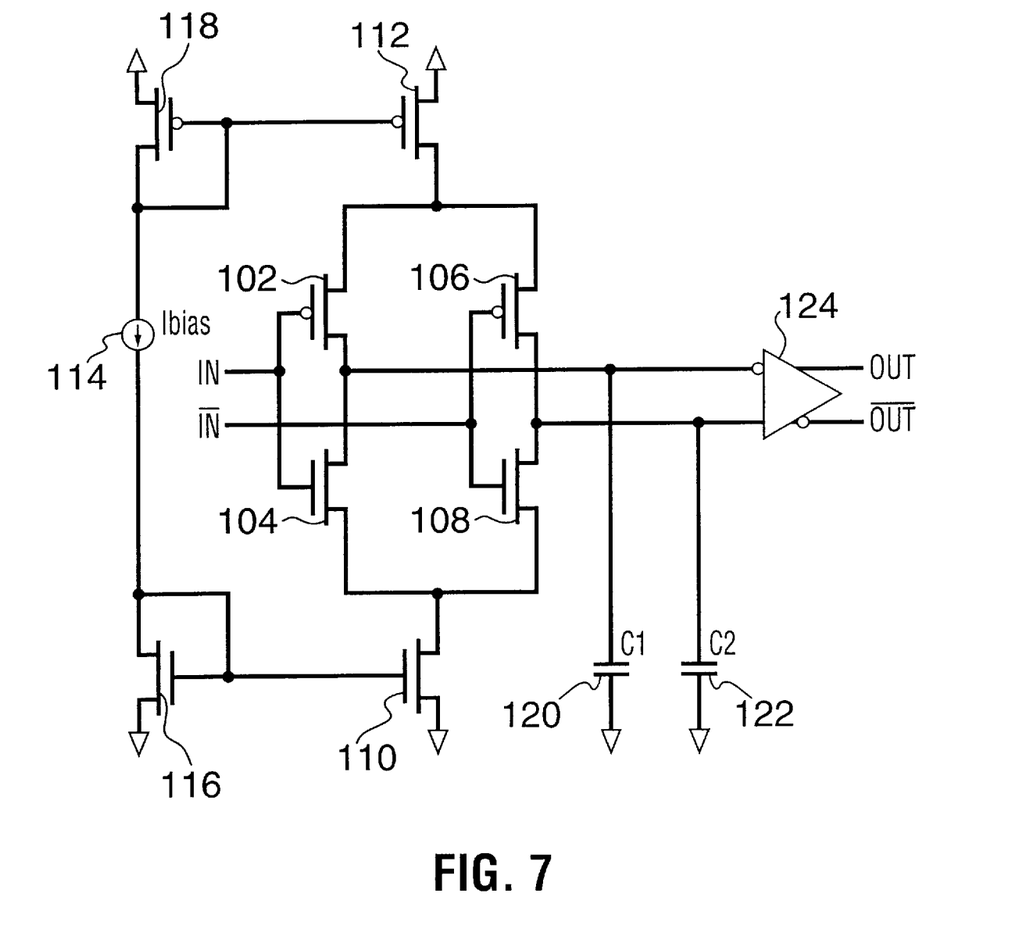
FIG. 7 is a schematic diagram of single starved inverter delay cell.

Referring to FIG. 7 there is shown a unit delay cell used in FIGS. 5 and 6. Transistors 102, 104, 106, and 108 form a pair of starved inverters. Transistors 110 and 112 form the starved inverter current sources, while current generator 114, and transistors 116 and 118 form voltage references for transistors 110 and 112. The starved inverters' constant output currents drive the capacitors 120 and 122. Differential amplifier 124 senses the voltage across capacitors 120 and 122 and switches its digital output when its input voltages, taken from capacitors 120 and 122, cross.

The circuit of FIG. 7 has several advantageous properties. The propagation delay through the cell consists of two portions. One is a strong function of process, temperature and voltage and is due to transistors 102, 104, 106, 108, and amplifier 124. The other is predominantly determined by the current generator 114, and capacitors 120 and 122. By keeping either current generator 114, or capacitors 120 and 122 constant, the other may be varied to control this portion of the cell propagation delay while the portion of the delay controlled by process, temperature, and voltage remains unchanged.

The sensitivity of the circuit of FIG. 7 to process variations is at least as good as that of the starved inverter and RC delay lines of FIGS. 3 and 4. In both of these circuits the product of R and C determines the unit delay. Since in the circuit of FIG. 7, the current generator 114 may be generated by forcing a known voltage across a resistor, the unit delay may also be determined by an RC product.

The sensitivity to power supply variation is also reduced. A larger power supply will result in stronger turn-on of transistors 102, 104, 106, and 108 and slightly faster reaction of differential amplifier 124 to having the voltage on its inputs cross. However, since the voltage on the two capacitors start at the power supply rails and slew to the opposite rails, the delay time will tend to increase for an increased power supply. These two processes tend to cancel each other out.

The sensitivity of the circuit of FIG. 7 to temperature variation can easily be compensated for by deliberately introducing a proportional to absolute temperature dependency to current generator 114. In practice, a 10% increase in current from current generator 114 at high temperatures cancels out the effects that the elevated temperatures would otherwise have on the circuit.

The fully-differential structure from end-to-end within the delay line cancels out any high-low/low-high process variation in the individual circuit components and reduces the sensitivity of the circuit to external noise.

Differential amplifier 124 may be self-biased, and since the starved inverter transistors 102, 104, 106, 108, 110, and 112 saturate with DC power supply voltages across capacitors 120 and 122, in this case the only DC power dissipation in the circuit occurs in the reference circuitry current generator 114, and transistors 116 and 118.

Figure 8:
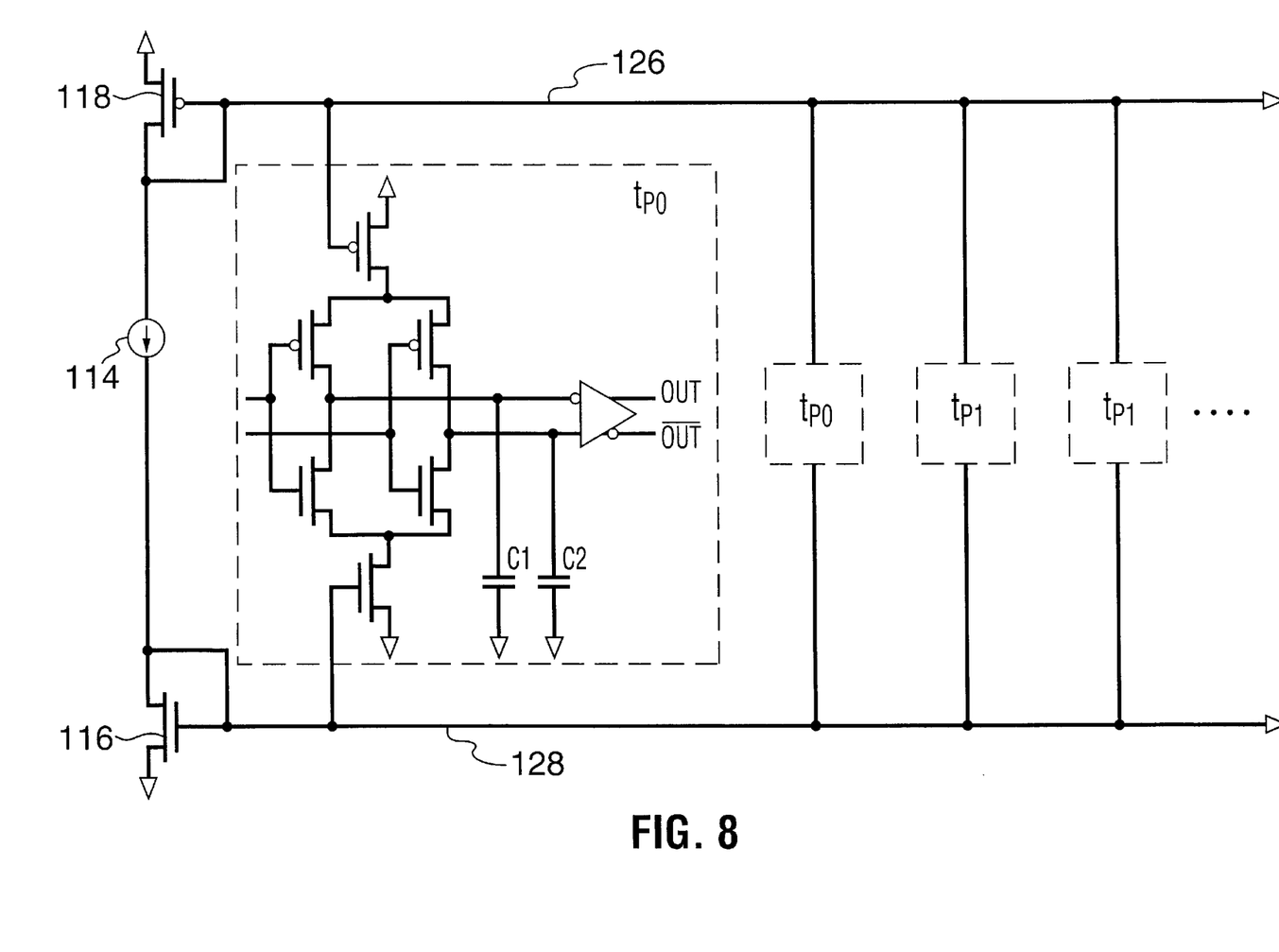
FIG. 8 is a schematic circuit diagram of a plurality of starved inverter delay cells in sequence sharing a single current generator.

The circuit of FIGS. 5 and 6 is thus made up of unit cells of the configuration of FIG. 7 except that the current generator 114, and transistors 116 and 118 are shared between all of the unit cells by running the lines 126 and 128 as shown in FIG. 8. The two unit propagation delays $t_{P0}$ and $t_{P1}$ are generated by changing the values of capacitors 120 and 122 between two otherwise-identical unit delay cells. The resulting cells are compact and self-contained, allowing simple layout of the complete delay line with a minimum of interconnection.

Figure 9:
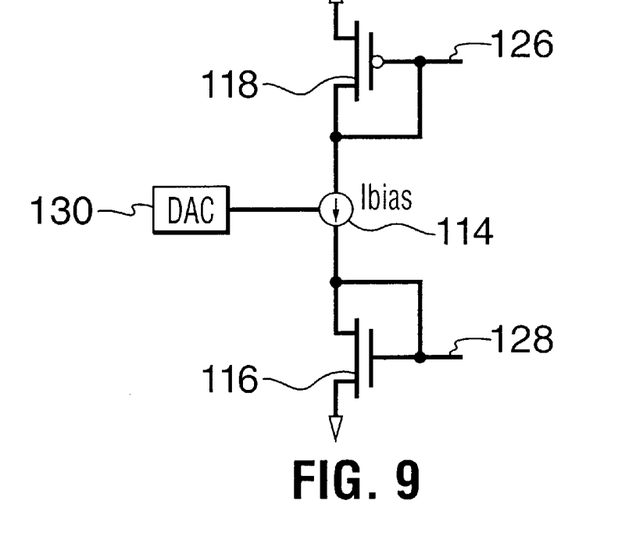
FIG. 9 is a diagram of the current generator controlled by a digital to analog converter.

Digital control of the delay line is achieved by controlling the bias current generated by the current generator 114 with a digital to analog converter (DAC) 130 as shown in FIG. 9. The resulting delay line produces unit output delays smaller than a delay cell's minimum propagation delay. Moreover the delay is digitally controllable, insensitive to process, temperature and voltage variations, accurate to within an RC delay product, consumes a minimum of DC power, uses fully-differential circuit techniques throughout, and occupies a minimum of layout area.

Figure 10:
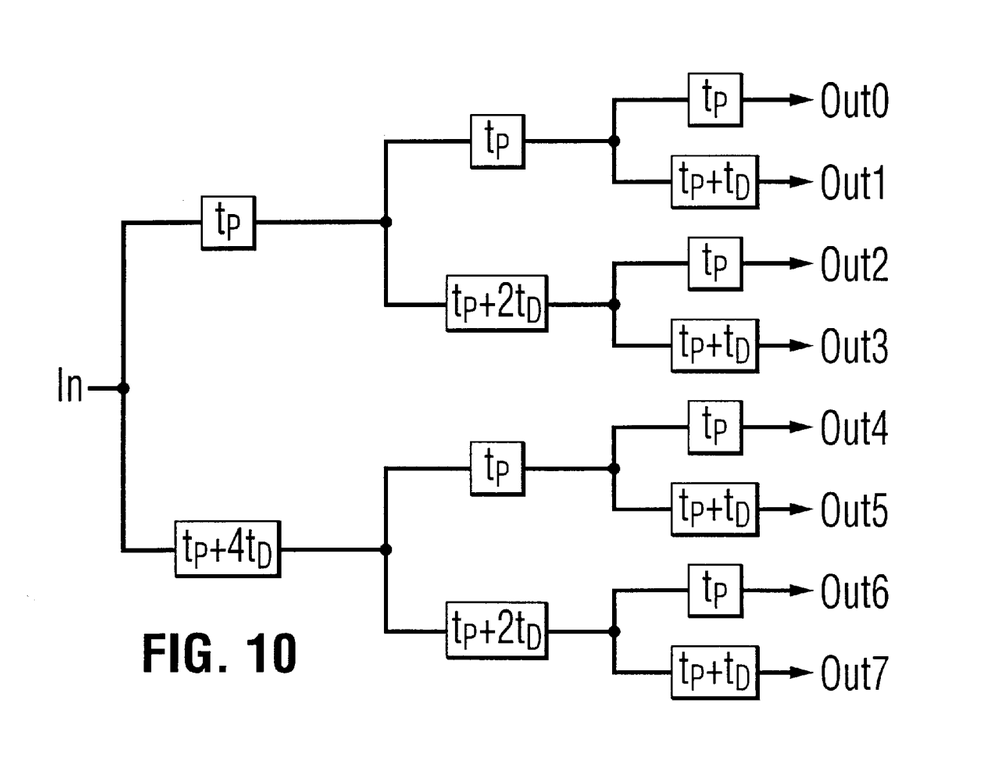
FIG. 10 is a binary tree with weighted delays in each branch and sub-branch.

An alternative embodiment of FIG. 6 as shown in FIG. 10 utilizes binary-weighted delay cells instead of cascading 2 or 4 individual stages. The binary weighting is accomplished by varying capacitors 120 and 122 in FIG. 7. Such an embodiment saves power over the embodiment of FIG. 6 but has less accurate delay-to-delay correlation as the digital control inputs to the bias current generator 114 is varied and so is more suited to a constant-unit delay circuit.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A delay circuit having N outputs where N≧2, comprising:

N outputs each coupled to a common input through N−1 serially connected unit delay cells, where for each output there are P unit delay cells having a unit delay of $t_{P0}$ and N−1−P unit delay cells having a unit delay of $t_{P1}$, the N outputs being ordered such that each output other than the first is delayed with respect to an immediately preceding output by $t_{P1}-t_{P0}$, wherein the difference $t_{P1}-t_{P0}$ may be smaller than either $t_{P1}$ or $t_{P0}$ and P goes in succession from N−1 to 0 in unit steps wherein each value of P corresponds to only one of said N outputs.

2. A delay circuit according to claim 1, wherein each unit delay cell has:

(a) a pair of starved inverters, each starved inverter made up of a pMOS and nMOS transistor with a drain of the pMOS transistor connected to a drain of the nMOS transistor, and the gates of the pMOS and nMOS transistors connected together, wherein the source of the pMOS transistor of a first one of said pair is connected to the source of a second one of said pair, and the source of the nMOS transistor of a first one of said pair is connected to the source of the nMOS transistor of a second one of said pair, the gates of said pair of starved inverters providing a differential input and the drains of the pMOS transistors of said pair of starved inverters providing a differential output;

(b) a pMOS current source having a drain coupled to the sources of said pMOS transistors of said pair of starved inverters and a source coupled to a positive voltage supply line;

(c) an nMOS current source having a drain coupled to sources of the nMOS transistors of said pair of starved inverters and a source coupled to a negative voltage supply line;

(d) a differential amplifier having an inverting input coupled to the drain of said pMOS transistor of a first one of said pair of starved inverters and a non-inverting input coupled to a drain of said pMOS transistor of a second one of said pair of starved inverters;

(e) a first capacitor coupled between the inverting input of said differential amplifier and a negative voltage supply line; and (f) a second capacitor, substantially identical to said first capacitor, coupled between the non-inverting input of said differential amplifier and a negative voltage supply line.

3. A delay circuit according to claim 2, wherein a gate of said pMOS current source is coupled to a voltage reference source comprising a pMOS transistor having its gate coupled to its source, a source of said pMOS transistor coupled to a current generator and a drain of said pMOS transistor coupled to the positive voltage supply line, and a gate of said nMOS current source is coupled to a voltage reference source comprising an nMOS transistor having its gate coupled to its source and its drain coupled to a negative voltage supply line.

4. A delay circuit according to claim 2, wherein said first and second capacitors are variable.

5. A delay circuit according to claim 2, wherein said differential amplifier is self-biased.

6. A delay circuit according to claim 3, wherein said current generator has bias current which is adjustable.

7. A delay circuit according to claim 6, including a digital to analog converter coupled to said current generator to control the amount of bias current produced thereby.

8. A delay circuit having N outputs from respective N parallel delay lines where N≧2, comprising:

an Rth output of said N outputs coupled to the input through an Rth one of said N parallel delay lines, each of said N parallel delay lines having N−1 serially connected unit delay cells, and the Rth delay line having N−R serially connected unit delay cells with unit delays of $t_{P0}$ and R−1 serially connected unit delay cells which have unit delays of $t_{P1}$;

wherein R is an integer going from 1 to N and signals from an Rth output are delayed from corresponding signals on an (R−1)th output by $t_{P1}-t_{P0}$ for all values of R wherein the difference $t_{P1}-t_{P0}$ may be smaller than either $t_{P1}$ or $t_{P0}$.

9. A delay circuit according to claim 8, wherein each unit delay cell has (a) a pair of starved inverters, each starved inverter made up of a pMOS and nMOS transistor with a drain of the pMOS transistor connected to a drain of the nMOS transistor, and the gates of the pMOS and nMOS transistors connected together, wherein the source of the pMOS transistor of a first one of said pair is connected to the source of a second one of said pair, and the source of the nMOS transistor of a first one of said pair is connected to the source of the nMOS transistor of a second one of said pair, the gates of said pair of starved inverters providing a differential input and the drains of the pMOS transistors of said pair of starved inverters providing a differential output;

(b) a pMOS current source having a drain coupled to the sources of said pMOS transistors of said pair of starved inverters and a source coupled to a positive voltage supply line;

(c) an nMOS current source having a drain coupled to sources of the nMOS transistors of said pair of starved inverters and a source coupled to a negative voltage supply line;

(d) a differential amplifier having an inverting input coupled to the drain of said pMOS transistor of a first one of said pair of starved inverters and a non-inverting input coupled to a source of said pMOS transistor of a second one of said pair of starved inverters;

(e) a first capacitor coupled between the inverting input of said differential amplifier and a negative voltage supply line; and (f) a second capacitor, substantially identical to said first capacitor, coupled between the non-inverting input of said differential amplifier and a negative voltage supply line.

10. A delay circuit according to claim 8, wherein a gate of said pMOS current source is coupled to a voltage reference source comprising a pMOS transistor having its gate coupled to its source, a source of said pMOS transistor coupled to a current generator and a drain of said pMOS transistor coupled to the positive voltage supply line, and a gate of said nMOS current source is coupled to a voltage reference source comprising an nMOS transistor having its gate coupled to its source and its drain coupled to a negative voltage supply line.

11. A delay circuit according to claim 9, wherein said first and second capacitors are variable.

12. A delay circuit according to claim 9, wherein said differential amplifier is self-biased.

13. A delay circuit according to claim 10, wherein said current generator has bias current which is adjustable.

14. A delay circuit according to claim 13, including a digital to analog converter coupled to said current generator to control the amount of bias current produced thereby.

15. A delay circuit having N outputs where $N=2^Q$ and Q is an integer >1, comprising:

(a) $2^{k-1}$ zeros branches each having $N/2^k$ serially connected unit delay cells each with a unit delay $t_{P0}$, (b) $2^{k-1}$ ones branches each having $N/2^k$ serially connected unit delay cells each with a unit delay $t_{P1}$;

wherein k goes from Q in unit steps down to 1;

and wherein, for each value of k, inputs of said $2^{k-1}$ zeros branches are connected to inputs of corresponding ones of said $2^{k-1}$ ones branches to form $2^{k-1}$ common terminals;

and wherein the N outputs are ordered such that each output other than the first is delayed with respect to an immediately preceding output by $t_{P1}-t_{P0}$ wherein the difference $t_{P1}-t_{P0}$ may be smaller than either $t_{P1}$ or $t_{P0}$.

16. A delay circuit according to claim 15, wherein each unit delay cell has (a) a pair of starved inverters, each starved inverter made up of a pMOS and nMOS transistor with a drain of the pMOS transistor connected to a drain of the nMOS transistor, and the gates of the pMOS and nMOS transistors connected together, wherein the source of the pMOS transistor of a first one of said pair is connected to the source of a second one of said pair, and the source of the nMOS transistor of a first one of said pair is connected to the source of the nMOS transistor of a second one of said pair, the gates of said pair of starved inverters providing a differential input and the drains of the pMOS transistors of said pair of starved inverters providing a differential output;

(b) a pMOS current source having a drain coupled to the sources of said pMOS transistors of said pair of starved inverters and a source coupled to a positive voltage supply line;

(c) an nMOS current source having a drain coupled to sources of the nMOS transistors of said pair of starved inverters and a source coupled to a negative voltage supply line;

(d) a differential amplifier having an inverting input coupled to the drain of said pMOS transistor of a first one of said pair of starved inverters and a non-inverting input coupled to a drain of said pMOS transistor of a second one of said pair of starved inverters;

(e) a first capacitor coupled between the inverting input of said differential amplifier and a negative voltage supply line; and (f) a second capacitor, substantially identical to said first capacitor, coupled between the non-inverting input of said differential amplifier and a negative voltage supply line.

17. A delay circuit according to claim 15, wherein a gate of said pMOS current source is coupled to a voltage reference source comprising a pMOS transistor having its gate coupled to its source, a source of said pMOS transistor coupled to a current generator and a drain of said pMOS transistor coupled to the positive voltage supply line, and a gate of said nMOS current source is coupled to a voltage reference source comprising an nMOS transistor having its gate coupled to its source and its drain coupled to a negative voltage supply line.

18. A delay circuit according to claim 16, wherein said first and second capacitors are variable.

19. A delay circuit according to claim 16, wherein said differential amplifier is self-biased.

20. A delay circuit according to claim 17, wherein said current generator bias current is adjustable.

21. A delay circuit according to claim 20, including a digital to analog converter coupled to said current generator to control the amount of bias current produced thereby.

* * * * *

UNITED STATES PATENT AND TRADEMARK OFFICE
CERTIFICATE OF CORRECTION

PATENT NO : 6,054,884
DATED : Apr. 25, 2000
INVENTOR(S): William Michael Lye

It is certified that error appears in the above-identified patent and that said Letters Patent are hereby corrected as shown below:

Column 2, line 52,
replace "delay unit cells"
with - - unit delay cells - -

Column 2, line 55,
replace "$t_{p0} - t_{p0}$"
with - - $t_{p1} - t_{p0}$ - -

Signed and Sealed this

Twenty-fourth Day of April, 2001

Attest:

NICHOLAS P. GODICI

Attesting Officer     Acting Director of the United States Patent and Trademark Office